United States Patent
Park

[11] Patent Number: 6,103,137
[45] Date of Patent: Aug. 15, 2000

[54] METHOD FOR ETCHING OXIDE FILM IN PLASMA ETCHING SYSTEM

[75] Inventor: Jae-Hyun Park, Chungcheongbuk-do, Rep. of Korea

[73] Assignee: LG Semicon Co., Ltd., Chungcheongbuk-do, Rep. of Korea

[21] Appl. No.: 09/027,808

[22] Filed: Feb. 23, 1998

[30] Foreign Application Priority Data

Dec. 16, 1997 [KR] Rep. of Korea .................. 97-69282

[51] Int. Cl.$^7$ .................................................. C23F 1/00
[52] U.S. Cl. .......................... 216/67; 216/46; 216/72; 438/294; 438/696; 438/723; 438/738
[58] Field of Search ........................ 216/41, 46, 67, 216/72, 74; 438/696, 703, 710, 722, 723, 724, 738, 743, 744, 294

[56] References Cited

U.S. PATENT DOCUMENTS

| | | | |
|---|---|---|---|
| 4,162,185 | 7/1979 | Coburn | 438/723 |
| 5,173,151 | 12/1992 | Namose | 438/699 |
| 5,286,344 | 2/1994 | Blalock et al. | 438/723 |
| 5,366,590 | 11/1994 | Kadomura | 438/723 |
| 5,429,710 | 7/1995 | Akibe et al. | 438/714 |
| 5,538,922 | 7/1996 | Cooper et al. | |
| 5,658,425 | 8/1997 | Halmam et al. | 438/620 |
| 5,662,819 | 9/1997 | Kadomura | 438/711 |
| 5,741,742 | 4/1998 | Kamide | 438/653 |
| 5,785,807 | 7/1998 | Kanai et al. | 156/662.1 |
| 5,798,016 | 8/1998 | Oehrlein et al. | 156/345 |
| 5,814,563 | 9/1998 | Ding et al. | 438/714 |
| 5,843,847 | 12/1998 | Pu et al. | 438/723 |
| 5,869,404 | 2/1999 | Kim et al. | 438/738 |
| 5,874,013 | 2/1999 | Tokunaga et al. | 216/68 |

*Primary Examiner*—Randy Gulakowski
*Assistant Examiner*—Allan Olsen

[57] ABSTRACT

Method for etching an oxide film in a plasma etching system, specifically in a high concentration plasma etching system, is disclosed, in which a mixture of new etching gas chemistry of first, second and third gases is used in forming an oxide film suitable to an integrated circuit with a high device packing density, for improving an etch rate and an etch selectivity of the oxide film to a sub-layer, the mixture gas consisting of $CHF_X/C_aHF_b/C_YF_Z$, $CHF_X/CH_bF/C_YF_Z$ or $CHF_X/CH_aF_b/C_YF_Z$.

14 Claims, 6 Drawing Sheets

METHOD FOR ETCHING OXIDE FILM IN PLASMA ETCHING SYSTEM

BACKGROUND OF THE INVENTION

1. Field of the Invention

The present invention relates to a method for etching an oxide film in a plasma etching system, specifically in a high concentration plasma etching system, in which a mixture of new etching gas chemistry of first, second and third gases is used in forming an oxide film suitable to an integrated circuit with a high device packing density, for improving an etch rate and an etch selectivity of the oxide film to a sub-layer.

2. Discussion of the Related Art

In etching the oxide film, RIE or plasma etching have been used, and recently, high concentration plasma etching has been increasingly used. For an etching gas, though Ar, $CF_4$, $CHF_3$ or $CHF_3/O_2$ has been used, since they can not provide a satisfactory selectivity to a sub-layer, a gas having a high C/F ratio has been partially applied, recently. As the Ar stabilizes plasma and enhances sputtering, but is not directly involved in any reaction, major etching reaction is caused by $CF_4$ and $CHF_3$, and the etch selectivity to a sub-layer in an etching is dependent on a ratio of application of these two gases. That is, when the C/F ratio is high, polymer production is increased to increase the selectivity to the sub-layer, and when the C/F ratio is low, an opposite trend appears. Ar gas flow rate is in a range of 200~1000 sccm, and $CF_4$ and $CHF_3$ gas flow rates are respectively in a range of 30~100 sccm. The flow ratio of these two gases, determined with respect to a desired selectivity, is $CF_4/CHF_3=0.5~1.5$. A RF power, dependent on a wafer size and a device structure, is at a level of 700 W to 1300 W. When the remaining photoresist is removed after completion of the etching process, a contact point is formed.

A background art method for fabricating a semiconductor device having the aforementioned oxide film etching applied thereto will be explained. FIGS. 1a~1g illustrate sections showing the steps of a background art method for fabricating a semiconductor device having a mixture gas of Ar, $CF_4$ and $CHF_3/O_2$ applied thereto.

Referring to FIG. 1a, a polysilicon film and a silicon nitride film are deposited on a silicon substrate 1 and selectively removed, to form a gate electrode 2 and a cap gate insulating film 3, and the substrate is lightly doped using the gate electrode 2 as a mask, to form lightly doped regions 4 therein. As shown in FIG. 1b, sidewall insulating films 5 of silicon nitride are formed at sides of the gate electrode 2 and the cap gate insulating film 3. As shown in FIG. 1c, the substrate 1 is heavily doped using the sidewall insulating films 5 and the cap gate insulating film 3 as masks, to form source/drain regions 6 therein. As shown in FIG. 1d, an oxide film 7 is deposited on the entire surface. As shown in FIG. 1e, a photoresist film 8 is formed on the oxide film 7 and subjected to exposure and development, to define a bitline contact hole region. The oxide film 7 is selectively removed using the photoresist film 8 as a mask, to form the bitline contact hole. Ar, $CF_4$ and $CHF_3$ mixture gas is used in the removal of the oxide film 7. Then, as shown in FIG. 1g, the photoresist film 8 is removed.

In the case of selective removal of the oxide film to form a contact hole as shown in FIG. 1f, if the contact region is not defined accurately due to misalign of mask, a case can be occurred when, not only the nitride films of the sidewall insulating films, but also the polysilicon of the gate electrode are etched in the oxide film etching as shown in FIG. 2, because the oxide film etching with Ar, $CF_4$ and $CHF_3$ mixture gas has a low etch selectivity.

Therefore, the background art oxide etching has the following problems.

First, the background art etching has a limitation in securing a selectivity to a sub-layer. That is, though the selectivity is adjusted by using a flow ratio of $CF_4$ and $CHF_3$, due to a limitation in an available selectivity, a loss of the sub-layer by the etching can not be controlled to be below 300 Å, and the unwanted etching even to the sidewall insulating films and the gate electrode in the contact hole patterning leads to a drop of a yield.

Second, since the microloading effect involved in current gas chemistry of Ar, $CF_4$, $CHF_3$ and $CHF_3/O_2$ and current etching device does not allow application to an oxide film etching of a small pattern, the background art etching can not be applied to a small sized contact required for an integrated circuit with a high device packing density.

Third, the low etch rate of the background art Ar, $CF_4$, $CHF_3$ and $CHF_3/O_2$ mixture gas does not allow application to formation of a contact hole with an aspect ratio greater than 3:1.

Fourth, the current chemistry involving high C/F ratio has difficulty in securing an appropriate gas combination and condition, and particularly it has difficulty in regulating the amount of polymer in the plasma, resulting in clogging of the hole or the process not being reproducible. Therefore a level as required in the current device can not be obtained.

SUMMARY OF THE INVENTION

Accordingly, the present invention is directed to a method for etching an oxide film in a plasma etching system that substantially eliminates one or more of the problems due to limitations and disadvantages of the related art.

An object of the present invention is to provide a method for etching an oxide film in a plasma etching system, which allows an excellent etching of a small pattern of oxide film required for an integrated circuit with a high device packing density, a reduction of device steps by providing a high etch rate and high selectivity, a high degree of integration to reduce the overall chip size, and to secure a fabrication tolerance sufficient to apply to a small sized contact structure with a great aspect ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for etching an oxide film in a plasma etching system, wherein the oxide film is etched using a mixture gas consisting of a first gas which is a main etching source gas, a second gas for adjusting the profile angle of an etching object, and a third gas for providing a high selectivity of the oxide film to materials other than the oxide film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

First, in view of the system, the present invention is a technology that can employ any of currently used plasma sources, particularly, a technology that can make best use of merits of a high concentration plasma source. That is, with a high concentration plasma, such as ICP(Inductively Coupled Plasma) or helicon, a fabrication time period can be shortened because the high concentration plasma can etch at a high etch rate(over 800 Å/min.). And, as the high concentration plasma allows conduction of an etching at a low pressure, with a wide variety of gas chemistry selection, gases with high selectivities can be employed.

Second, in view of gas chemistry, the present invention employs a mixture gas of $CHF_3$, $C_2HF_5$ and $C_4F_8$, a mixture gas of $CHF_3$, $C_2HF_5$ and $C_3F_8$, a mixture gas of $CHF_3$, $CH_3F$ and $C_3F_6$, a mixture gas of $CHF_3$, $CH_2F_2$ and $C_2F_4$ or a mixture gas of $CHF_3$, $CH_2F_2$ and $C_4F_8$, for improving a selectivity to a sub-layer and a high etch rate. In this instance, a ratio of the mix of the gases is preferably 2:2:1 or 2:2:0.5.

The first gas, $CHF_3$, serves as a main etch source gas, the second gas, $C_aHF_b$ or $CH_aF_b$, serves as an etch source gas supplementing $CHF_3$ in the plasma as an angle adjusting gas capable of partial adjustment of etchability and profile by increasing a gas flow rate which is used in adjusting a profile angle of an etch object, and the third gas, $C_xF_y$, having a very high C/F ratio of 0.5:1 of its own with a high polymer production rate, is a selectivity adjusting gas that provides a high selectivity of the oxide film to materials other than the oxide film by increasing carbon in the plasma by decomposition of the gas. By employing such a combination, the present invention is applicable to a high selectivity process required for an integrated circuit with a high device packing density, particularly to a self-align contact process. In the present invention, a gas flow rate is in a range of 10–50 sccm for $CHF_3$ and $CH_2F_2$, 5–25 sccm for $C_4F_8$. A ratio of $CHF_3/C_4F_8$ gases is preferably 1.5~2.5. A range of RF power is dependent on the system, and is a level of 1000 W~3000 W in the present invention.

A method for fabricating a semiconductor device in accordance with a preferred embodiment of the present invention having the aforementioned method for etching an oxide film applied thereto will be explained. FIGS. 3a~3g illustrate sections showing the steps of a method for fabricating a semiconductor device provided for explaining a method for etching an oxide film having a mixture gas of $CHF_3/C_2HF_5/C_4F_8$ applied thereto, in accordance with a preferred embodiment of the present invention.

Figure 1A:
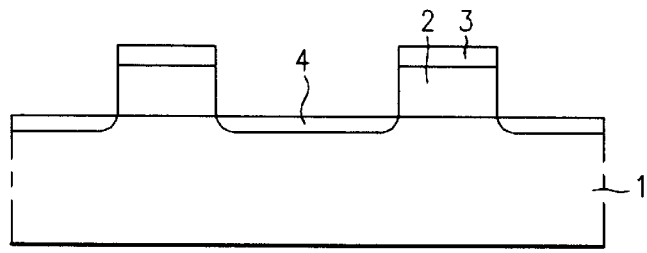
FIGS. 1a~1g illustrate sections showing the steps of a method for fabricating a semiconductor device provided for explaining a background art method for etching an oxide film having a mixture gas of Ar, $CF_4$ and $CHF_3/O_2$ applied thereto.
Figure 1B:
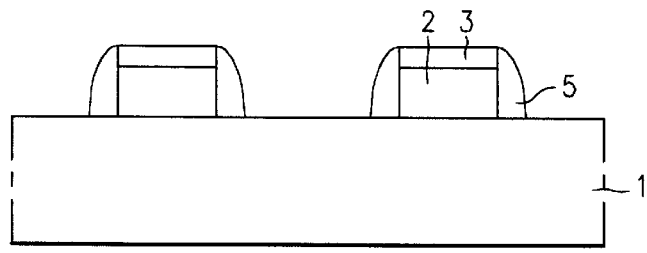
Figure 1C:
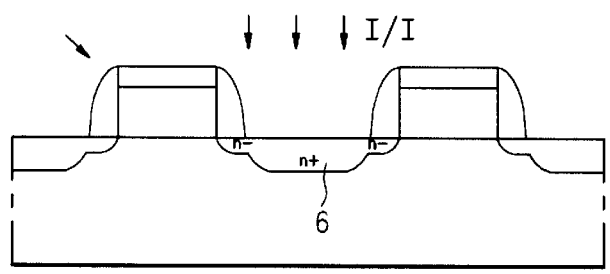
Figure 1D:
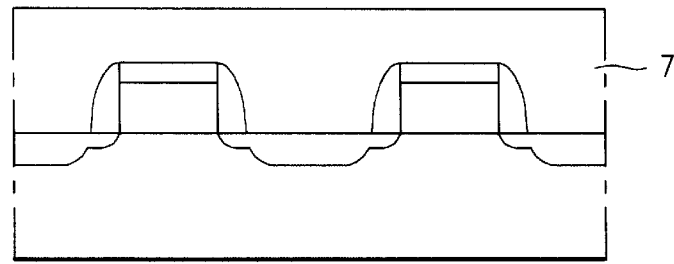
Figure 1E:
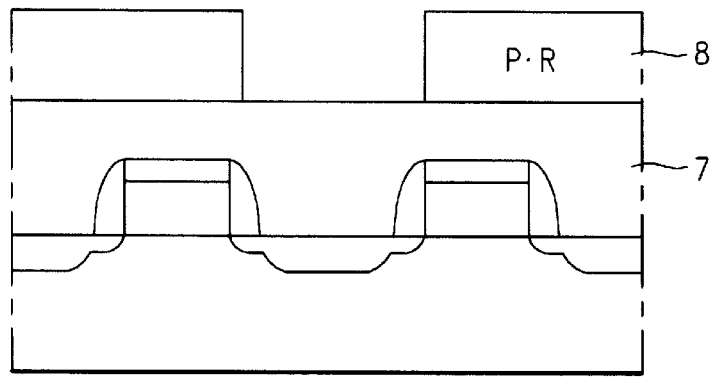
Figure 1F:
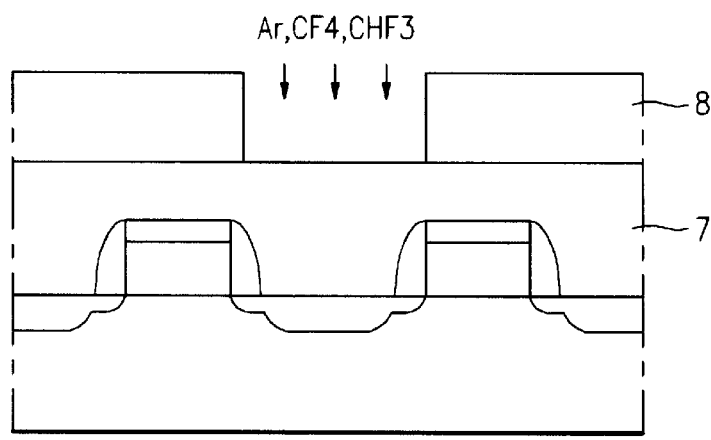
Figure 1G:
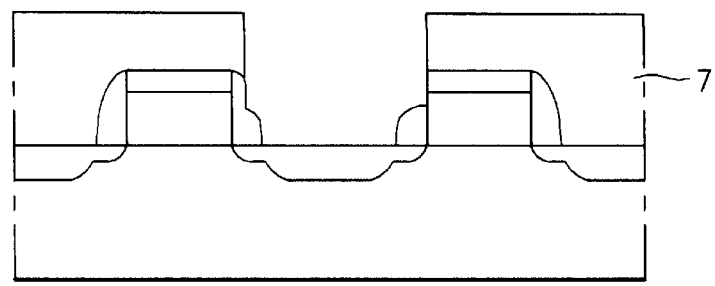
Figure 2:
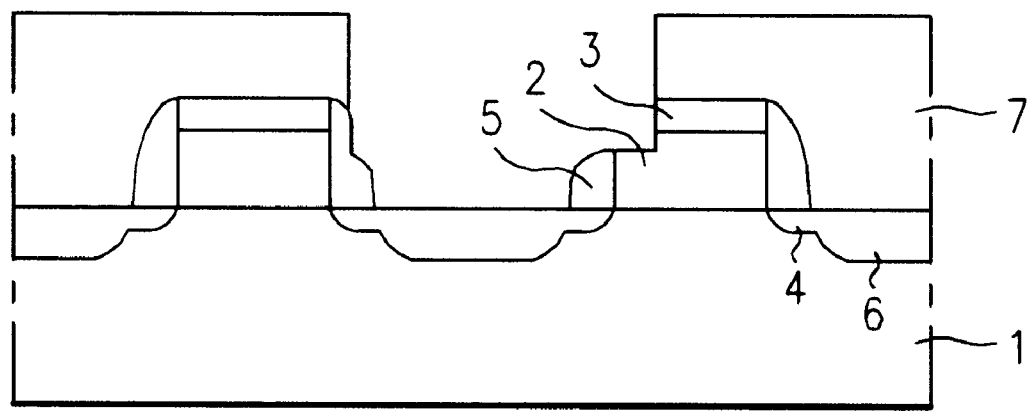
FIG. 2 illustrates a section of a semiconductor device having the background art oxide film etching applied thereto.
Figure 3A:
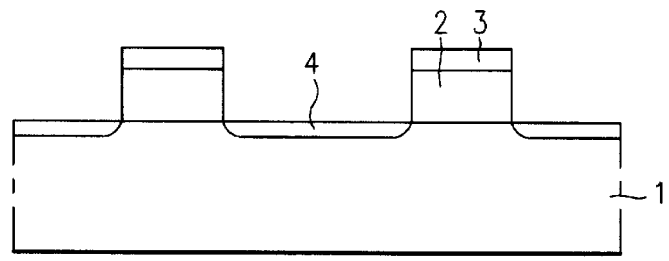
FIGS. 3a~3g illustrate sections showing the steps of a method for fabricating a semiconductor device provided for explaining a method for etching an oxide film having a mixture gas of $CHF_3/C_2HF_5/C_4F_8$ applied thereto, in accordance with a preferred embodiment of the present invention; and, FIG. 4 illustrates a section of a semiconductor device having an oxide film etching of the present invention applied thereto.
Figure 3B:
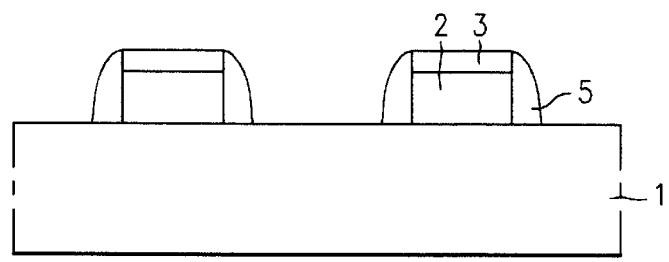
Figure 3C:
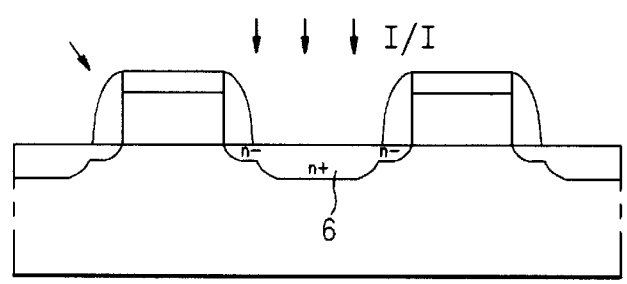
Figure 3D:
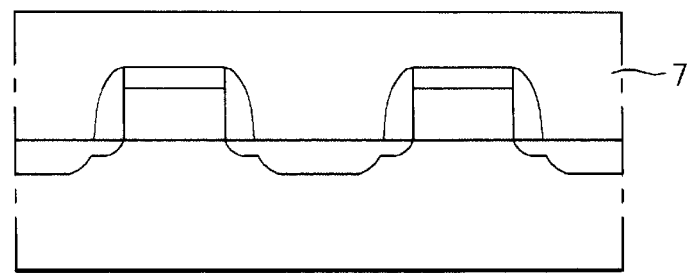
Figure 3E:
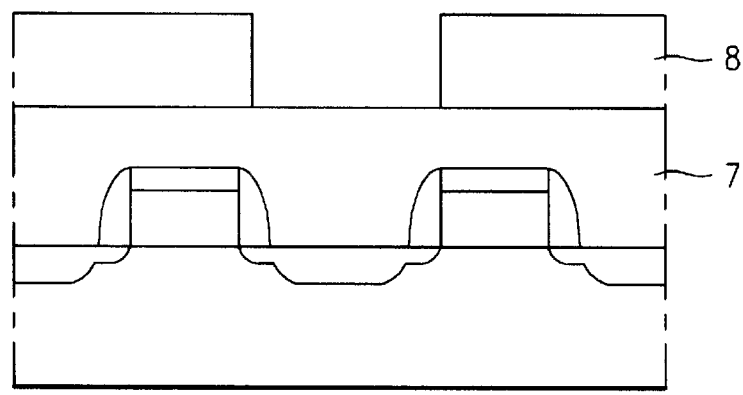
Figure 3F:
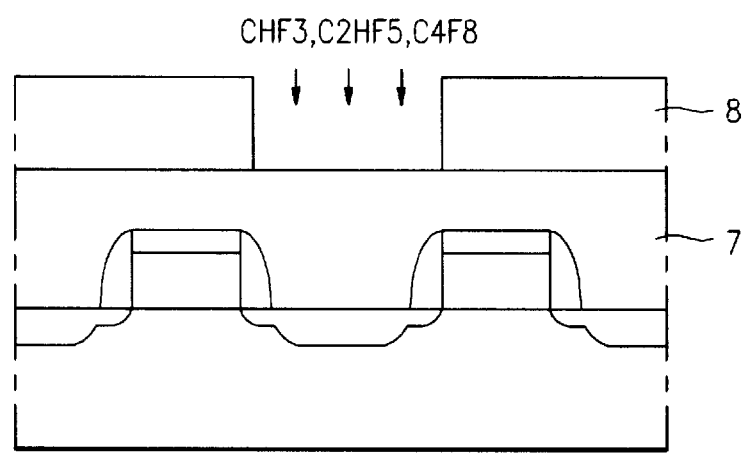
Figure 3G:
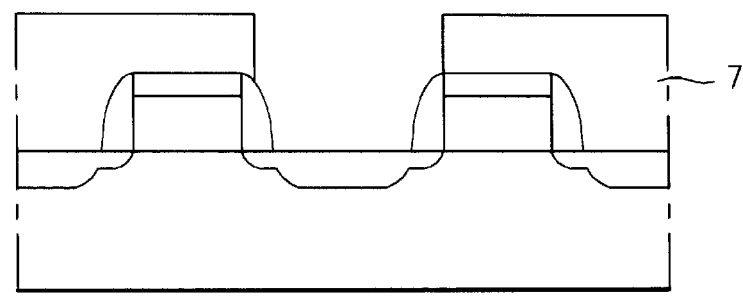
Figure 4:
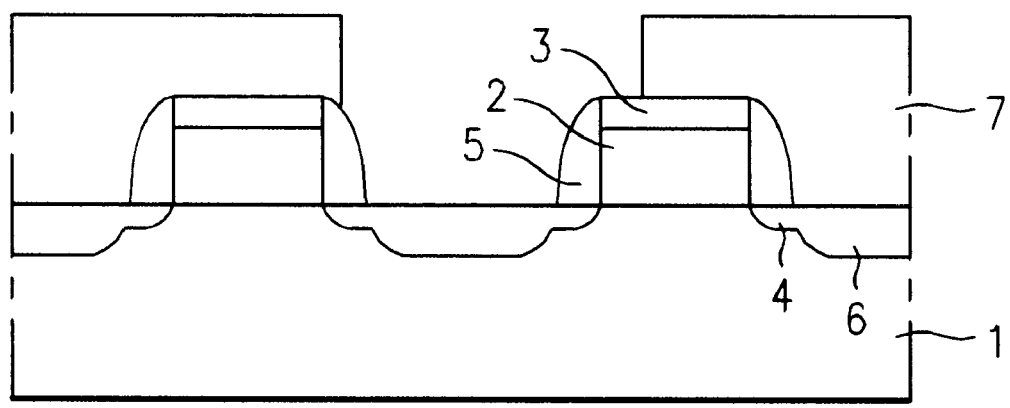

Referring to FIG. 3a, a polysilicon film and a silicon nitride film are deposited on a silicon substrate 1 and selectively removed, to form a gate electrode 2 and a cap gate insulating film 3, and the substrate is lightly doped using the gate electrode 2 as a mask, to form lightly doped regions 4. As shown in FIG. 3b, sidewall insulating films 5 of nitride are formed at sides of the gate electrode 2 and the cap gate insulating film 3. As shown in FIG. 3c, the substrate 1 is heavily doped using the sidewall insulating films 5 and the cap gate insulating film 3, to form source/drain regions 6. As shown in FIG. 3d, an oxide film 7 is deposited on the entire surface. As shown in FIG. 3e, a photoresist film 8 is deposited on the oxide film 7 and subjected to exposure and development to define a bitline contact hole region. As shown in FIG. 3f, the oxide film 7 is selectively removed using the photoresist film 8 as a mask, to form a bitline contact hole. In the removal of the oxide film 7, a mixture of $CHF_3/C_2HF_5/C_4F_8$ gases is applied thereto under an ambient and flow ratio given above. And, finally, as shown in FIG. 3g, the photoresist film 8 is removed. Herein, even when an accurate contact region can not be defined due to a misalignment of the mask in the formation of a contact hole by a selective removal of the oxide film as shown in FIG. 3f, the oxide film etching of the present invention using a mixture of $CHF_3/C_2HF_5/C_4F_8$ gases provides a satisfactory etch tolerance because the nitride of the sidewall insulating films as well as the substrate are not etched as shown in FIG. 4 in the oxide film etching due to the high etch selectivity.

As has been explained, the method for etching an oxide film using a mixture of $CHF_3/C_2HF_5/C_4F_8$ gases of the present invention has the following advantages.

First, whereas the background art etching technology has a limitation in securing a selectivity to a sub-layer, the present invention which teaches etching of an oxide film using a mixture of $CHF_3/C_2HF_5/C_4F_8$ gases each having the aforementioned characteristic, particularly, $C_4F_8$ having a high C/F ratio, allows a process of a high selectivity required for an integrated circuit with a high device packing density.

Second, because the gas mixture of the present invention allows to secure a high selectivity even to a nitride suitable to a self-aligned contact formation, with a nitride loss controllable to be below 300 Å, that allows reduction of sizes of steps in the device, the present invention allows an overall chip size reduction by means of a higher integration.

Third, a satisfactory fabrication tolerance can be secured and application to a case of a small sized contact structure with a great aspect ratio is possible.

It will be apparent to those skilled in the art that various modifications and variations can be made in the method for etching an oxide film in a plasma etching system of the present invention without departing from the spirit or scope of the invention. Thus, it is intended that the present invention cover the modifications and variations of this invention provided they come within the scope of the appended claims and their equivalents.

What is claimed is:

1. A method for etching an oxide film in a plasma etching system, wherein the oxide film is etched using a mixture gas consisting essentially of:

a first gas which is a main etching source gas;

a second gas for adjusting a profile angle of an etching object; and a third gas for providing a high selectivity of the oxide film to materials other than the oxide film, wherein the first, second and third gases are fluorocarbons.

2. The method as claimed in claim 1, wherein the first, second and third gases are $CHF_3$, $C_2HF_5$ and $C_4F_8$, respectively.

3. The method as claimed in claim 2, wherein a flow rate is in a range of 10~50 sccm for $CHF_3$ and $C_2HF_5$ and 5~25 sccm for $C_4F_8$.

4. The method as claimed in claim 1, wherein the first, second and third gases are $CHF_3$, $C_2HF_5$ and $C_3F_8$, respectively.

5. The method as claimed in claim 1, wherein the first, second and third gases are $CHF_3$, $CH_3F$ and $C_3F_6$, respectively.

6. The method as claimed in claim 1, wherein the first, second and third gases are $CHF_3$, $CH_2F_2$ and $C_2F_4$, respectively.

7. The method as claimed in claim 1, wherein the first, second and third gases are $CHF_3$, $CH_2F_2$ and $C_4F_8$, respectively.

8. The method as claimed in claim 1, wherein a ratio of mix of the first, second and third gases is 2:2:1.

9. The method as claimed in claim 1, wherein a ratio of mix of the first, second and third gases is 2:2:0.5.

10. The method as claimed in claim 1, wherein a RF power range of the plasma is 1000 W~3000 W.

11. The method as claimed in claim 1, wherein a ratio of gas of the first, and third gases is 1.5~2.5.

12. A method for etching an oxide film in a plasma etching system, comprising the steps of:

forming an oxide film on a substrate;

forming a mask on the oxide film; and etching portions of the oxide film unmasked by the mask using a mixture gas consisting essentially of $CHF_3/C_2HF_5/C_4F_8$.

13. A method for etching an oxide film in a plasma etching system, comprising the steps of:

forming a gate electrode and a cap gate insulating film on a semiconductor substrate;

forming a source region and a drain region in the semiconductor substrate on both sides of the gate electrode;

forming a sidewall insulating films at sides of the gate electrode;

forming an oxide film on an entire surface of the substrate including the gate electrode and the sidewall insulating films;

forming a photoresist film on the oxide film such that a portion of the oxide film over the drain region is exposed; and selectively etching the portion of the oxide film using a mixture gas consisting essentially of $CHF_3/C_2HF_5/C_4F_8$.

14. The method as claimed in claim 13, wherein the cap gate insulating film and the sidewall insulating films are formed of nitride.

* * * * *